(12) United States Patent
Roussel et al.

(10) Patent No.: US 6,468,091 B2
(45) Date of Patent: Oct. 22, 2002

(54) ELECTRICAL DISTRIBUTION CENTER

(75) Inventors: Matthew G Roussel, Austintown; Joseph Matthew Senk; Jeffrey A. Reeves, both of Cortland; Randall S Cvelbar, Hubbard, all of OH (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/802,436

(22) Filed: Mar. 9, 2001

(65) Prior Publication Data

US 2002/0126462 A1 Sep. 12, 2002

(51) Int. Cl.[7] ................................................. H05K 1/00
(52) U.S. Cl. .......................... 439/72; 361/744; 361/759; 361/801
(58) Field of Search ................................. 361/775, 752, 361/753, 736, 744, 728, 796, 800, 801, 802, 759; 439/68, 70, 71, 72, 74, 83

(56) References Cited

U.S. PATENT DOCUMENTS

| | | | | |
|---|---|---|---|---|
| 5,342,211 A | * | 8/1994 | Broeksteeg | ................. 439/108 |
| 5,613,882 A | * | 3/1997 | Hnatuck et al. | ............ 439/372 |
| 5,917,709 A | * | 6/1999 | Johnson | ...................... 361/803 |
| 6,213,786 B1 | * | 4/2001 | Matsui et al. | ............... 361/784 |
| 6,325,644 B1 | * | 12/2001 | Lemke et al. | .................. 439/83 |
| 6,328,600 B1 | * | 12/2001 | Fujiki et al. | ................ 439/570 |
| 6,375,476 B1 | * | 4/2002 | Goodwin et al. | ............. 439/71 |
| 6,382,989 B1 | * | 5/2002 | Yu | .............................. 439/686 |

* cited by examiner

Primary Examiner—Kamand Cuneo
Assistant Examiner—Jose' H. Alcala
(74) Attorney, Agent, or Firm—Thomas N. Twomey

(57) ABSTRACT

An electrical distribution center has a circuit board interposed between an upper housing and a lower housing. The upper housing has a panel provided with a universal cavity design by a multiplicity of terminal-receiving slots. The slots are arranged in laterally spaced parallel rows with the slots in each row in equally spaced apart relation to one another. Raised rails on the top side of the panel are parallel to the rows of slots and respectively occupy the spaces between the rows of slots. The circuit board has terminals extending into selected slots through the bottom side of the panel. The slots are adapted to receive the terminals of relays and fuses inserted through the top side of the panel for contact with the terminals of the circuit board. When the terminals of a relay are inserted in any of the slots, the relay body will be supported on rails on opposite sides of those slots. When the terminals of a fuse are inserted in any of the slots, the fuse body will fit down and nest between the rails on opposite sides of those slots.

14 Claims, 5 Drawing Sheets

ELECTRICAL DISTRIBUTION CENTER

This invention relates generally to electrical distribution centers and more particularly to an electrical distribution center provided with an upper housing having a universal cavity design.

BACKGROUND OF THE INVENTION

Electrical distribution centers are being widely used in motor vehicles. The electrical distribution center is simply a central junction box or block system designed as a stand-alone assembly. This junction block can package various fuses, relays and other electrical devices in a central location. Electrical distribution centers not only reduce costs by consolidating various functions into one block, but the centers also reduce the number of cut and spliced leads which helps to increase reliability. Such electrical distribution centers include provisions for electrically connecting a power source and electrical devices housed in the junction block to electrical wiring harness connectors for supplying power and control signals to various electrical systems of the vehicle.

An electrical distribution center has a circuit board interposed between an upper housing and a lower housing. Typically, the upper housing will have a special cavity design for receiving the terminals of the circuit board and the terminals of electrical devices such as fuses and relays. This special cavity design will vary depending on the uses intended for the electrical distribution center, and on the configuration of the electrical devices employed and their location in the distribution center. An upper housing having a particular cavity design may be required for an underhood center and an upper housing having a different cavity design may be required for an instrument panel center. What is needed is an upper housing which has a universal cavity design so that electrical distribution centers capable of performing a variety of different functions and usable in many different situations can be employed using the same upper housing.

SUMMARY OF THE INVENTION

In accordance with the present invention, the upper housing is provided with a universal cavity design so that the same upper housing can be used with distribution centers in a great many different applications. Preferably the cavity design is incorporated in an upper housing panel and includes a multiplicity of terminal-receiving slots arranged in laterally spaced parallel rows with the slots in each row equally spaced from one another. The slots are adapted to receive circuit board terminals extending into the slots through one side of the panel. The slots are also adapted to receive terminals of electrical devices such as fuses and relays, inserted through the opposite side of the panel for contact with the circuit board terminals.

The universal design of the upper housing panel is such that any one of the slots will receive the terminals of either a fuse or a relay. Preferably the top surface of the upper housing panel has raised rails between the rows of slots. When the terminals of a fuse are inserted in any of the slots, the fuse body will be received and nest between the rails on opposite sides of those slots. In the preferred embodiment, the rails have projections or ridges which engage recesses or grooves in the fuse body to properly locate the nested fuse body. When the terminals of a relay are inserted in any of the slots, the relay body will be supported upon the rails on opposite sides of those slots.

Preferably the panel has tapered ramps associated with each of the slots to guide the terminals of the electrical devices into the slots. It is also desirable to provide means for locating and retaining the terminals after they have been inserted into the slots.

One object of this invention is to provide an electric distribution center having the foregoing features and capabilities.

Other objects, features and advantages of the invention will become more apparent as the following description proceeds, especially when considered with the accompanying claims and drawings.

BRIEF DESCRIPTION OF THE DRAWINGS

FIGS. 8 and 9 show the terminals of relays and fuses inserted in the slots and FIG. 10 shows the relays and fuses separated from the slots.

DETAILED DESCRIPTION OF THE PREFERRED EMBODIMENT

Figure 1:
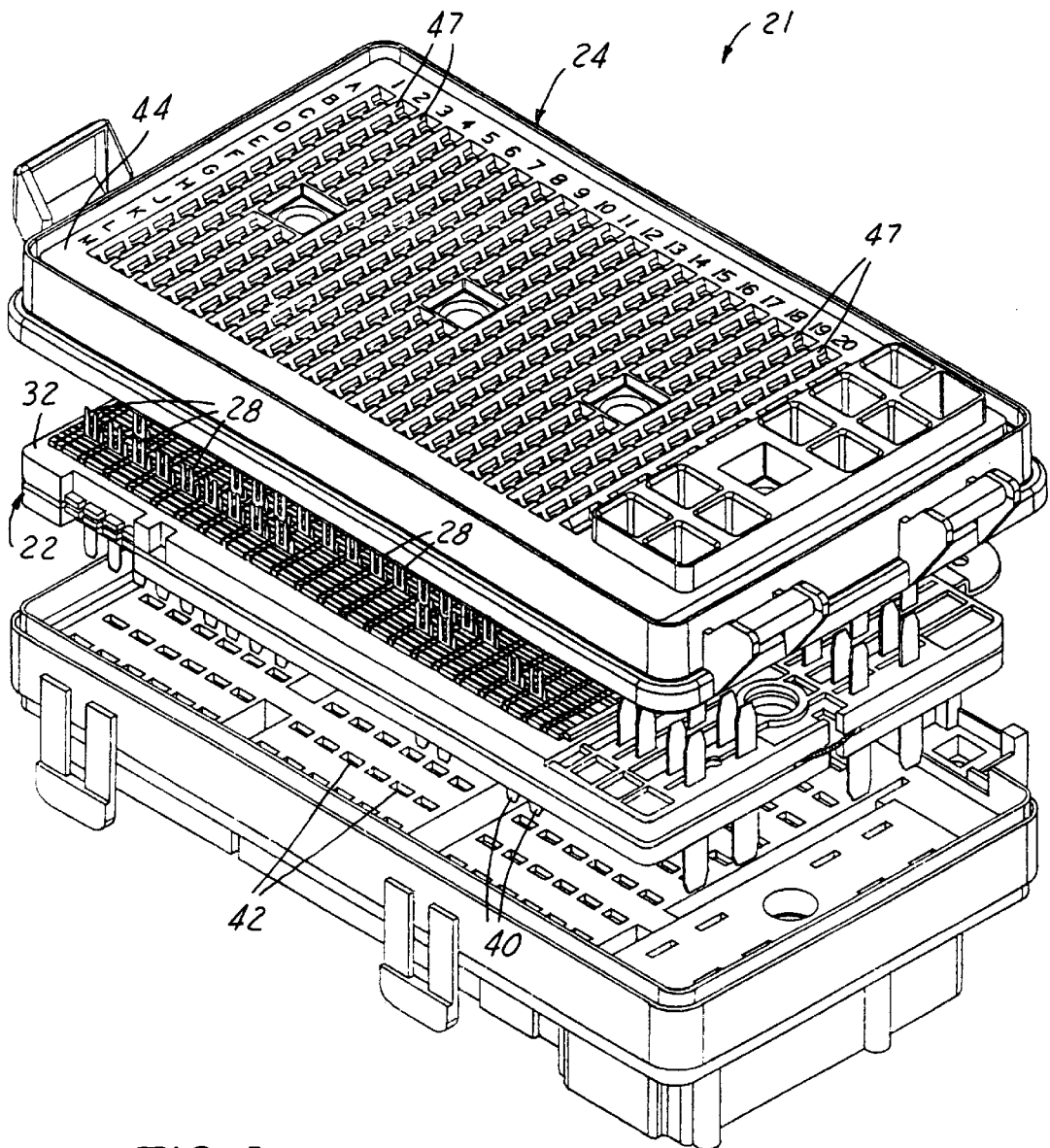
FIG. 1 is an exploded perspective view of an electrical distribution center constructed in accordance with this invention.
Figure 2:
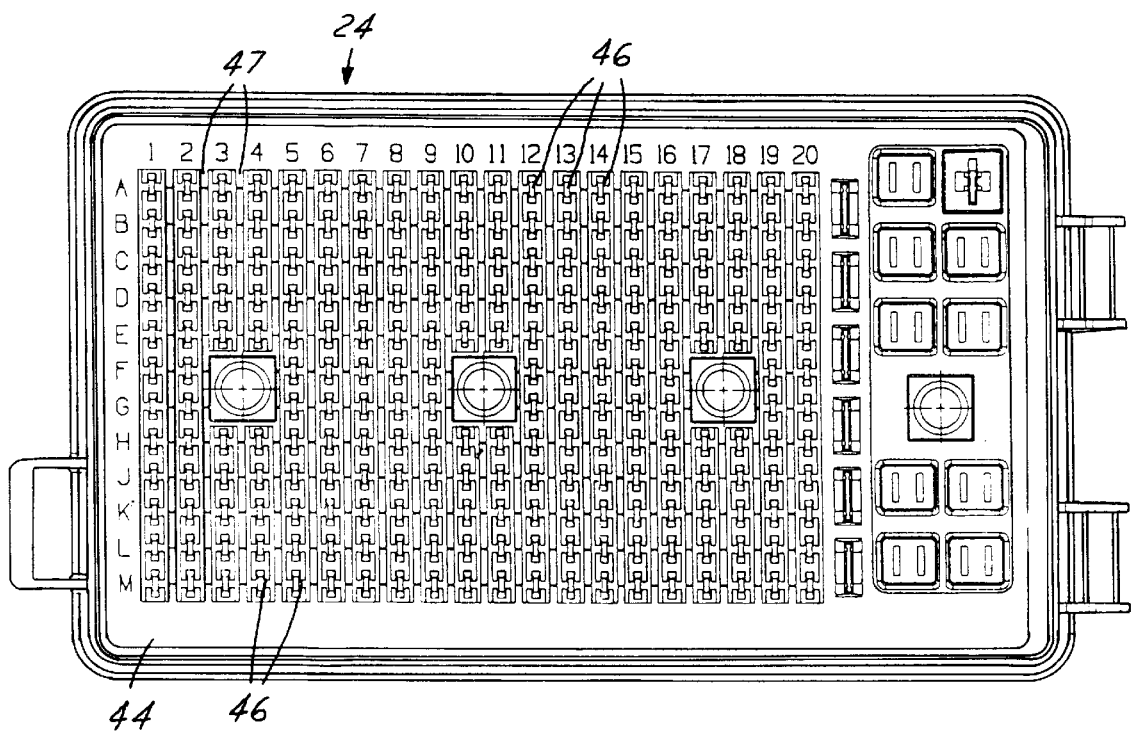
FIG. 2 is a top view of the upper housing of the electrical distribution center shown in FIG. 1.
Figure 3:
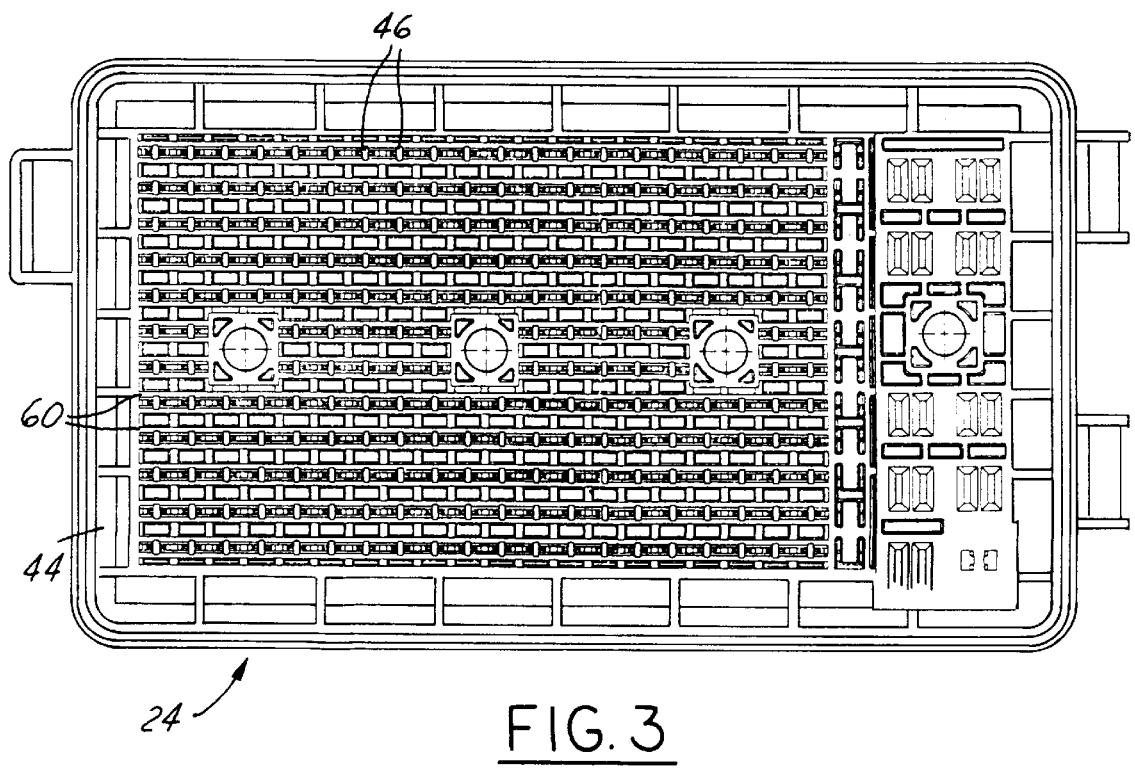
FIG. 3 is a bottom view of the upper housing.
Figure 5:
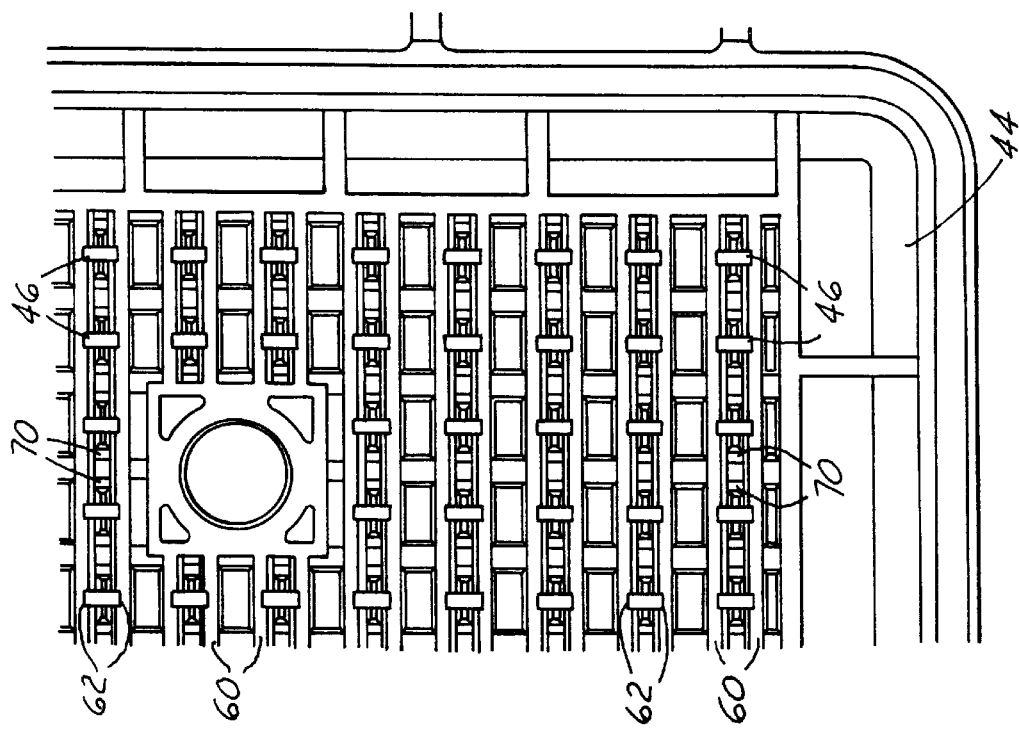
FIG. 5 is an enlarged fragmentary view of a portion of FIG. 3.
Figure 4:
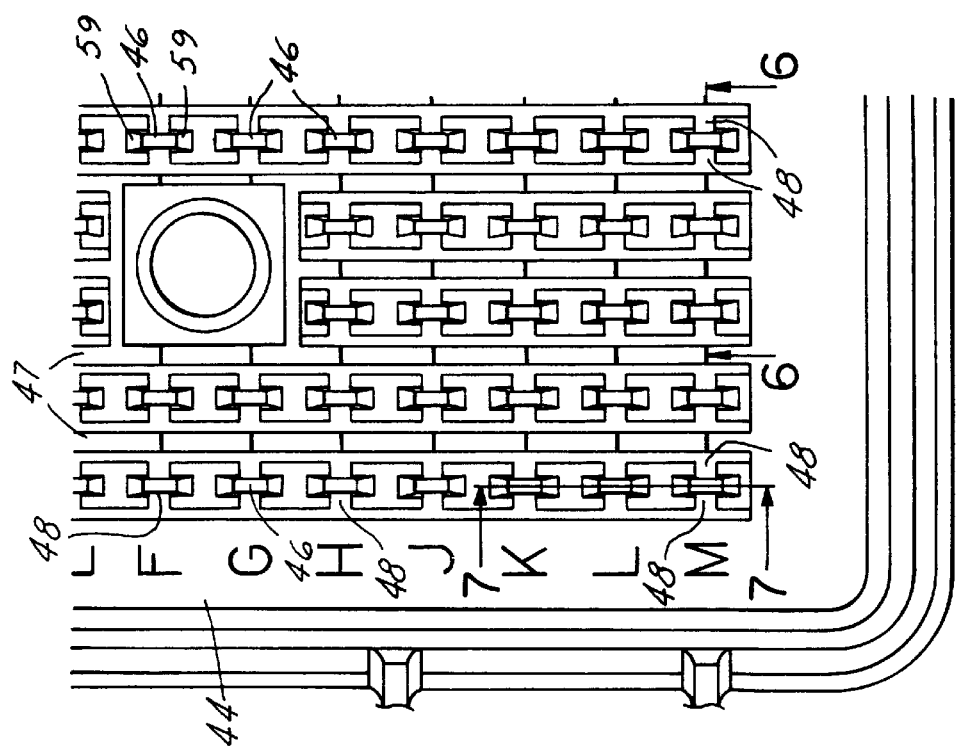
FIG. 4 is an enlarged fragmentary view of a portion of FIG. 2.

Referring now more particularly to the drawings, an electrical distribution center 21 is shown having a circuit board 22 interposed between an upper housing 24 and a lower housing 26. Both the upper and lower housings are formed of plastic or other suitable non-conducting material.

The circuit board 22 has a multiplicity of metal terminals 28 secured in holes in a flat board 32 of plastic or other suitable non-conducting material. Each terminal has a thin, flat, forked blade 34 projecting upwardly from the board 32 with a space between the tines 36 of the blade, and a second blade 40 projecting downwardly from the board through holes 42 in the lower housing 26. The blades 40 are adapted to make electrical contact with cable terminals (not shown) for supplying power to various electrical systems.

The upper housing 24 comprises a flat, rectangular panel 44 having a universal cavity design provided by a multiplicity of terminal-receiving slots 46 extending therethrough. The slots 46 are preferably arranged in laterally spaced rows 1–20 extending transversely of the panel with the slots in each of the rows in equally spaced apart relation to one another. The slots are elongated in a direction parallel to the rows. Raised rails 47 on the top side of the panel 44 extend parallel to the rows of slots and respectively occupy the spaces between the rows of slots. Thus, each row of slots is between two rails.

Figure 6:
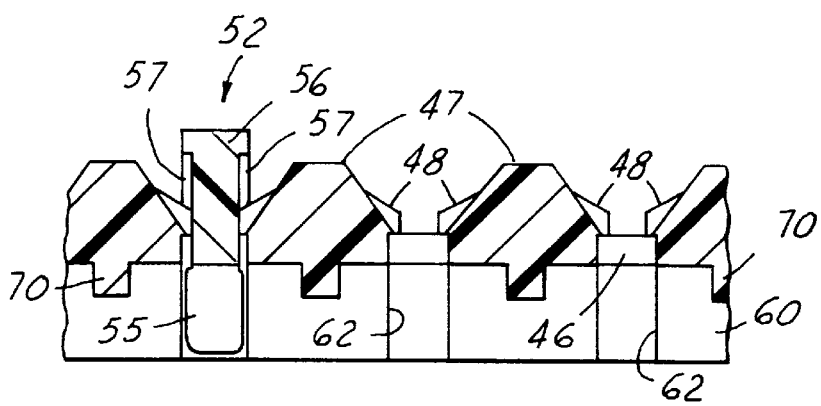
FIG. 6 is a sectional view taken on the line 6—6 in FIG. 4, showing a fuse associated with one of the slots in the panel of the upper housing.
Figure 7:
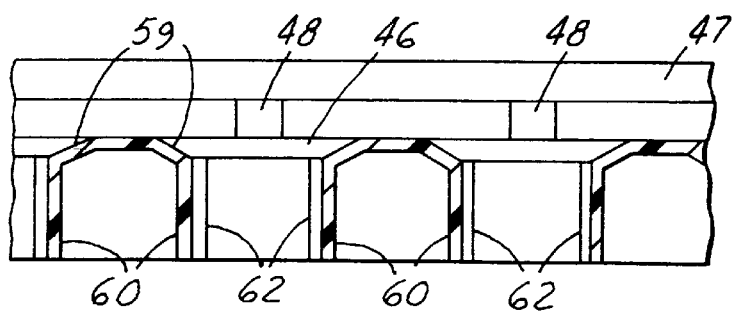
FIG. 7 is a sectional view taken on the line 7—7 in FIG. 4.
Figure 9:
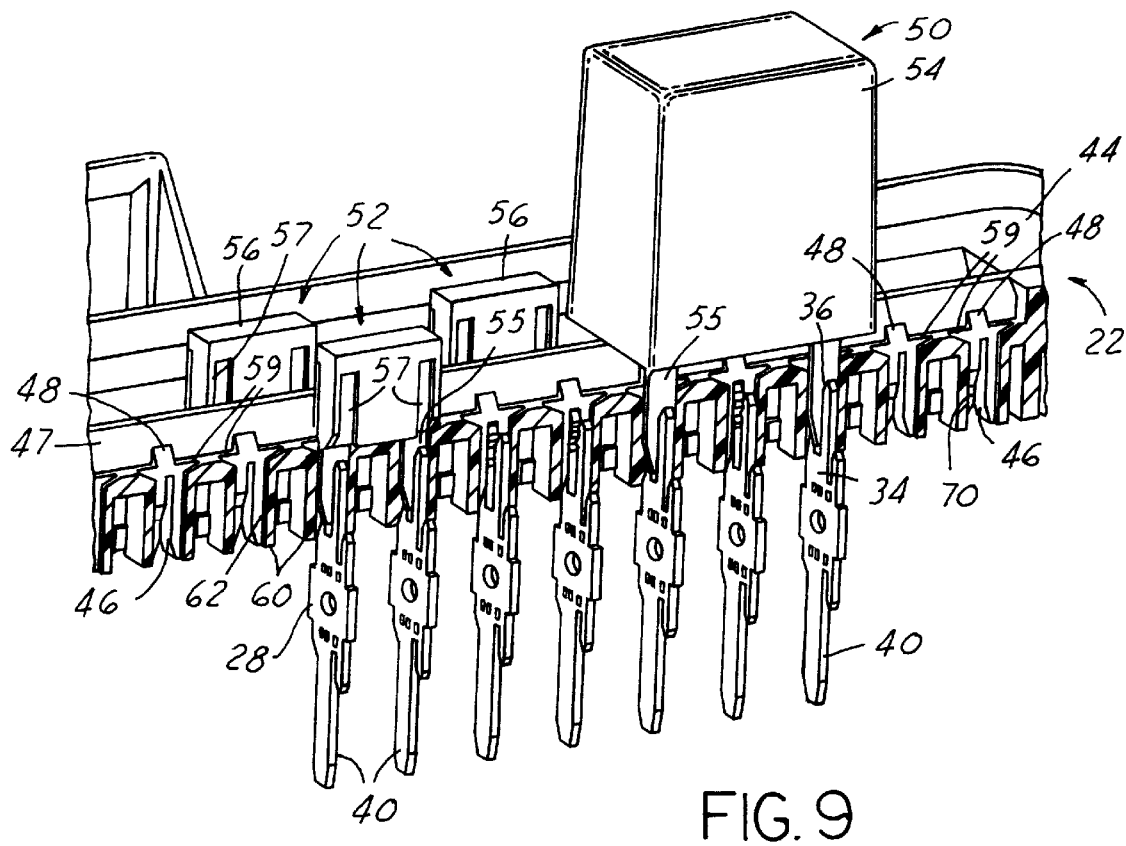

Each rail 47 has projections or raised ridges 48 on each side thereof, spaced apart equal distances along the length of the rail. See FIGS. 6 and 9. Each projection 48 is positioned alongside the midpoint of a slot 46, so that each slot 46 is between two projections, one such projection being on a rail on one side thereof and the other projection being on a rail on the opposite side thereof. The projections on opposite sides of each slot are tapered toward one another in a direction toward the panel 44.

Figure 10:
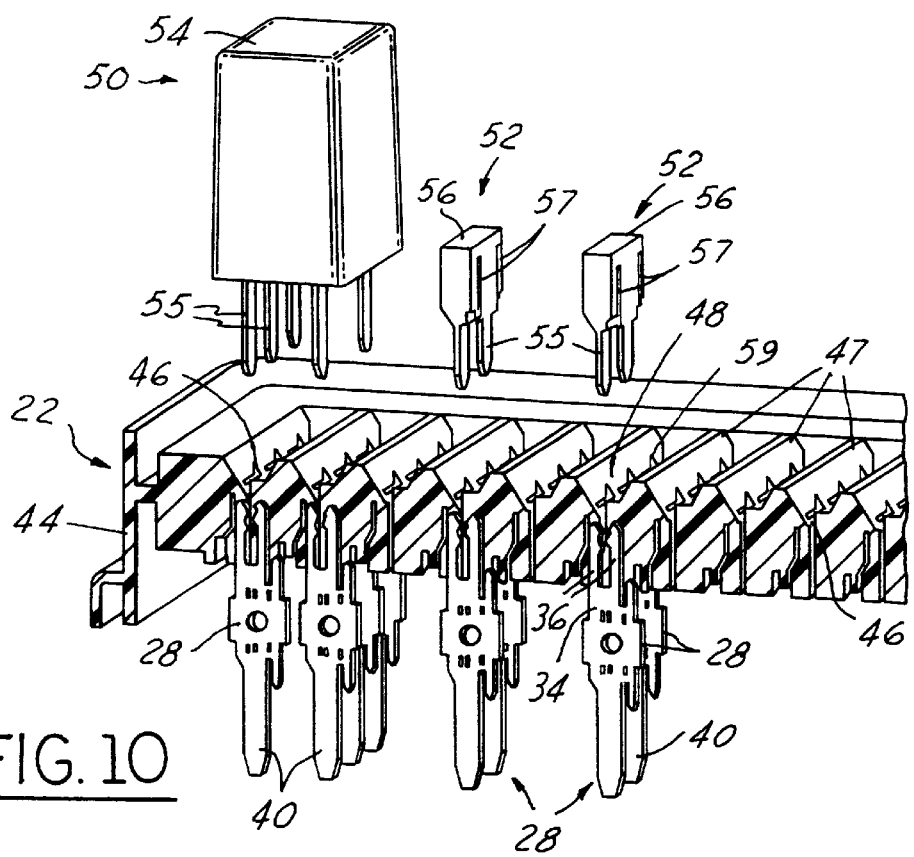
FIGS. 8, 9 and 10 are sectional views taken at an acute angle and showing several circuit board terminals inserted in slots in the upper housing panel.
Figure 8:
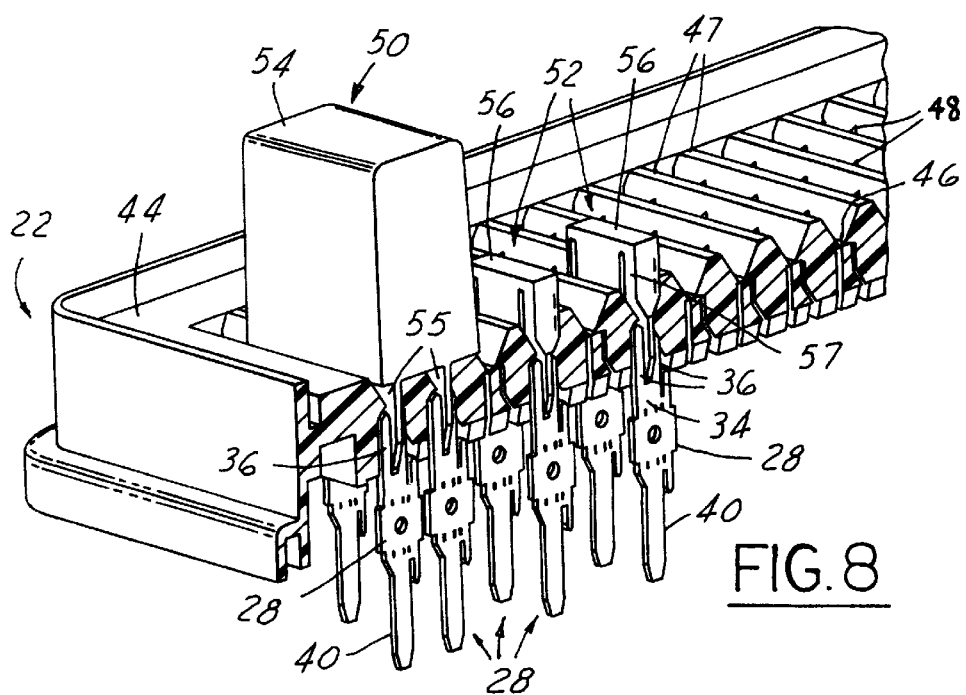

The terminals 28 of the circuit board project upwardly into the slots 46, or at least into some of the slots 46, of the panel 44. The slots 46 are also adapted to receive the terminals of electrical devices, here shown as relays 50 and fuses 52. The relays 50 have relay bodies 54 and the fuses 52 have fuse bodies 56. Each of the bodies 54 and 56 have two or more spaced apart relatively thin, flat terminals or blades 55 projecting therefrom. The blades 55 of the fuses and relays have opposite sides and edges and are adapted to extend downwardly into selected slots 46 of the panel 44 and into contact with the circuit board terminals 28 in the same slots (see FIGS. 8–10).

The fuse bodies 56 have laterally spaced apart vertical recesses or grooves 57 on each side thereof. The grooves on each side of each fuse body are spaced apart the same distance as adjacent projections 48 on each side of each of the rails 47. When a fuse 52 is pressed down so that its terminals engage in two adjacent slots 46 in the panel 44, the fuse body 56 will be received between the two rails on opposite sides of the slots and the grooves 57 on the fuse body will engage the projections 48 of the rails to be guided to a properly seated position nested between the rails.

The upper side of the panel 44 of the upper housing has tapered ramps 59 associated with each of the slots 46 to guide the blades 55 of the electrical devices 50, 52 into the slots. The ramps 59 are located at opposite ends of each slot.

The slots 46 in each of the rows 1–20 of slots are respectively aligned with slots in the other rows to provide a plurality of spaced apart lines A–M of slots perpendicular to the rows 1–20.

The underside of the panel 44 has a pair of ribs 60 on opposite sides of and parallel to each of the lines of slots. The ribs of each pair have confronting grooves 62 adjacent each slot for receiving the opposite edges of the blades 55 of the electrical devices 50 or 52 to locate the blades.

Stops 70 on the underside of the panel 44 between each pair of ribs 60 provide abutments to locate the blades 34 of the circuit board terminals 28 projecting through the slots 46 in the panel.

Because of its universal cavity design, the same upper housing can be used with distribution centers in a great many different applications and situations. This substantially reduces manufacturing costs and ultimate cost to the consumer. There is no need for one set of slots for relays and a different set of slots for fuses. All slots 46 in all rows are equally spaced so that the terminals of both the relays and the fuses are receivable in any of the slots, with the relatively large relay bodies 54 perched on the rails 47 and the relatively small fuse bodies 56 nested between rails.

When the terminals of a relay 50 are inserted in any of the slots 46, the relay body 54 will be supported on the rails on opposite sides of those slots. When the terminals of a fuse are inserted in any of the slots 46, the fuse body 56 will fit down and nest between the rails on opposite sides of those slots with the enterengaging rail projections 48 and fuse body grooves 57 serving to properly locate and retain the fuse body.

What is claimed is:

1. An electrical distribution center comprising;
   a circuit board,
   a universal cavity panel extending over said circuit board,
   said panel having a multiplicity of terminal-receiving slots extending therethrough,
   said slots being arranged in laterally spaced parallel rows with the slots in each of said rows in equally spaced apart relation to one another,
   said circuit board having terminals projecting outwardly therefrom, and
   electrical devices having terminals projecting outwardly therefrom,
   the terminals of the circuit board respectively extending into selected slots through one side of said panel,
   the terminals of the electrical devices being insertable into said slots through an opposite side of said panel for contact with the terminals of the circuit board.

2. An electrical distribution center as defined in claim 1, wherein said panel has on said opposite side thereof a plurality of raised rails extending parallel to said rows of slots and respectively occupying the spaces between said rows of slots.

3. An electrical distribution center as defined in claim 2, wherein some of said electrical devices have first bodies adapted to rest upon a plurality of said rails when the terminals thereof are inserted into selected slots in the panel and others of said electrical devices have second bodies adapted to be received and to nest between two adjacent rails when the terminals thereof are inserted into selected slots between the two adjacent rails.

4. An electrical distribution center as defined in claim 2, wherein said electrical devices include relays and fuses, said relays having relay bodies adapted to rest on a plurality of said rails when the terminals thereof are inserted in selected slots in said panel, said fuses having fuse bodies adapted to be received and to nest between two adjacent rails when the terminals thereof are inserted in selected slots between the two adjacent rails.

5. An electrical distribution center as defined in claim 4, wherein said slots are identical to one another and are all elongated in the same direction.

6. An electrical distribution center as defined in claim 5, wherein said opposite side of said panel has tapered ramps associated with each of said slots to guide the terminals of the relays and fuses into said slots, said ramps being located at opposite ends of each of said slots.

7. An electrical distribution center as defined in claim 5, wherein said panel on said one side thereof has stops on opposite sides of said slots for locating the terminals of said circuit board.

8. An electrical distribution center as defined in claim 5, wherein said panel on said one side thereof has means providing grooves for receiving and locating the terminals of said relays and fuses inserted into said slots.

9. An electrical distribution center as defined in claim 5, wherein the slots in each of said rows are respectively aligned with slots in each of the other rows to provide a plurality of spaced apart lines of slots, said terminals of the relays and fuses are in the form of relatively thin, flat, blades each having opposite edges and opposite sides, said panel has on said one side thereof a pair of ribs on opposite sides of and parallel to each of said lines of slots, the ribs of each of said pair having confronting grooves adjacent each slot of the associated line of slots for receiving the opposite edges of said blades to thereby locate said blades.

10. An electrical distribution center as defined in claim 9, wherein said panel on said one side thereof has stops on opposite sides of said slots and between said pairs of ribs for locating the terminals of the circuit board.

11. An electrical distribution center as defined in claim 5, wherein each of said rails has projections on opposite sides thereof, each said projection being positioned adjacent one of said slots so that each of said slots is between at least two of said projections, and each fuse body has grooves on opposite sides thereof adapted to receive selected projections of adjacent rails when said fuse bodies are received between said adjacent rails to properly locate the fuse bodies.

12. An electrical distribution center as defined in claim 11, wherein said projections on each side of each of said slots are tapered toward one another in a direction toward the panel.

13. An electrical distribution center as defined in claim 12, wherein the slots in each of said rows are respectively aligned with slots in each of the other rows to provide a plurality of spaced apart lines of slots, said terminals of the relays and fuses are in the form of relatively thin, flat, blades each having opposite edges and opposite sides, said panel has on said one side thereof a pair of ribs on opposite sides of and parallel to each of said lines of slots, the ribs of each pair having confronting grooves adjacent each slot of the associated line of slots for receiving the opposite edges of said blades to thereby locate said blades, and said panel on said one side thereof has stops on opposite sides of said slots and between said pairs of ribs for locating the terminals of the circuit board.

14. An electrical distribution center as defined in claim 13, wherein said opposite side of said panel has tapered ramps associated with each of said slots to guide the terminals of the relays and fuses into said slots, said ramps being located at opposite ends of each of said slots.

* * * * *